United States Patent [19]

Macemon

[11] 4,105,967
[45] Aug. 8, 1978

[54] AUTOMATIC RANGE SELECTION CIRCUIT

[75] Inventor: James H. Macemon, Glen Burnie, Md.

[73] Assignee: Baxter Travenol Laboratories, Inc., Deerfield, Ill.

[21] Appl. No.: 728,689

[22] Filed: Oct. 1, 1976

[51] Int. Cl.² ........................ G01R 15/08; H03F 1/36; G01J 3/30
[52] U.S. Cl. ..................................... 324/115; 330/86; 356/85
[58] Field of Search ..................... 324/115, 99 D, 131; 356/85; 330/86

[56] References Cited

U.S. PATENT DOCUMENTS

| | | | |
|---|---|---|---|
| 3,187,323 | 6/1965 | Flood et al. | 324/115 |
| 3,758,858 | 9/1973 | McCue | 324/115 |

Primary Examiner—Rudolph V. Rolinec
Assistant Examiner—Ernest F. Karlsen
Attorney, Agent, or Firm—Henry W. Collins; Richard G. Kinney; Thomas R. Vigil

[57] ABSTRACT

The automatic range selection circuit is particularly useful with a photomultiplier tube linear microphotometer and includes an amplifier, adjustable and switchable impedances coupled between an input and an output of the amplifier for adjusting the gain thereof, two comparators for comparing the output from the amplifier with upper and lower reference voltage levels, an integrator for integrating the output of the comparators, and an analog control circuit responsive to the output signal level at the output of the integrator for controlling the amount of impedance coupled between the input and output of the amplifier thereby to automatically adjust the gain thereof.

10 Claims, 1 Drawing Figure

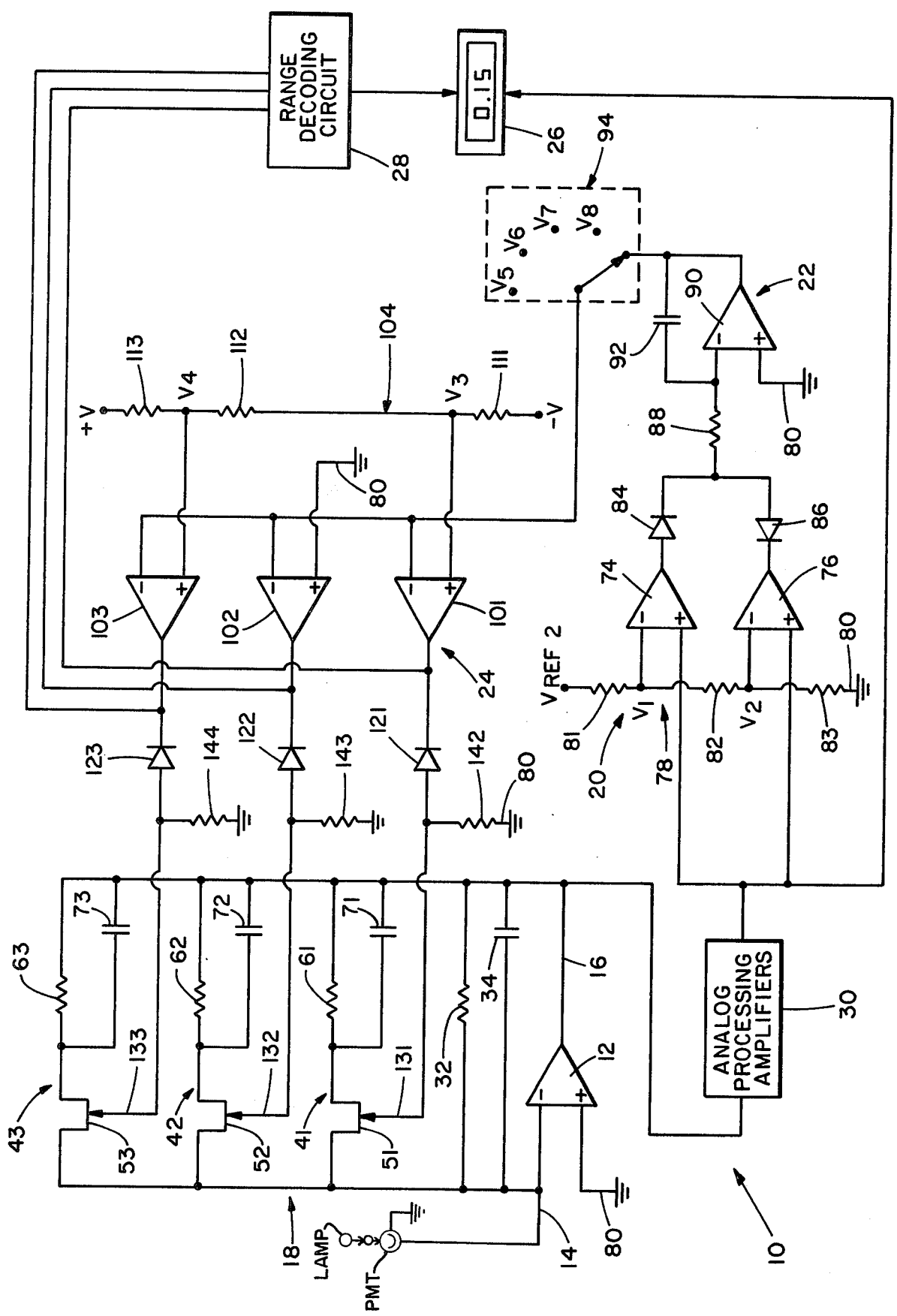

AUTOMATIC RANGE SELECTION CIRCUIT

BACKGROUND OF THE INVENTION

1. Field Of The Invention

The field of the invention is automatic range changing or selecting circuits for use with an amplifier having a high gain. Such circuits are useful for automatically changing the measuring range in a spectrofluorometer utilizing a photomultiplier tube linear microphotometer.

2. Description Of The Prior Art

Heretofore various automatic range changing or range selecting circuits have been proposed and examples of such circuits can be found in the following U.S. Pat. Nos.:
3,539,936
3,579,138
3,711,774
3,742,354
3,828,262
3,926,819
3,947,806

The automatic range selection circuit of the present invention, hereinafter described in detail, provides for easy and fast determination of a unknown output signal strength from a sensing circuit such as a photomultiplier tube. The automatic range selection circuit of the present invention has a number of advantages, many of which provide improvements over previously proposed automatic range changing circuits. Some of these advantages are as follows.

1. The automatic range selection circuit of the present invention has fewer electronic components than many of the previously proposed automatic range changing circuits.

2. The automatic range selection circuit of the present invention has incorporated therein by reason of the circuit elements and connections thereof hereinafter described in detail, automatic filtering whereby ranges are not switched on short noise spikes.

3. The automatic range selection circuit of the present invention will switch to a higher or lower range as necessary whereas many of the previously proposed automatic range changing circuits only scan ranges in one direction.

4. The circuit components and their connections in the automatic range selection circuit of the present invention can be easily changed or adjusted for the speed of the principal amplifier of the circuit whereby the automatic range selection circuit can be used with very fast or ultra slow time constants.

5. the automatic range selection circuit of the present invention is essentially an analog circuit and does not utilize clocks or other digital circuits utilized in many previously proposed auto range changing circuits. As a result, EMI problems which arise from the coupling of digital circuits to sensitive analog circuits are not incurred with the automatic range selection circuit of the present invention.

Other advantages of the range selection circuit of the present invention will be apparent from the description of the preferred embodiment of the invention set forth below.

SUMMARY OF THE INVENTION

According to the invention there is provided an automatic range selection circuit comprising an amplifier, adjustable impedance means coupled between an input and an output of said amplifier for controlling the gain of said amplifier, means for comparing the signal at said output from said amplifier with an upper voltage level and a lower voltage level, said comparing means being operable to generate a positive or negative control signal when the signal at said output from said amplifier is higher than said upper voltage level or lower than said lower voltage level and control means coupled to said adjustable impedance means and responsive to said control signal from said comparing means for automatically increasing or decreasing the amount of impedance coupled across said amplifier until the level of the signal at said output of said amplifier is between said upper and lower voltage levels.

BRIEF DESCRIPTION OF THE DRAWING

The FIGURE in the drawing is a schematic electrical circuit diagram of the automatic range selection circuit of the present invention.

DESCRIPTION OF THE PREFERRED EMBODIMENT

Referring now to the drawing in greater detail, there is illustrated therein a schematic diagram of the automatic range selection circuit of the present invention which is generally identified by reference numeral 10. The circuit 10 includes an input amplifier 12 which has an input 14 adapted to be connected to the output of a sensing circuit, such as a photomultiplier tube, and has an output 16. Adjustable and switchable impedance circuitry generally identified by reference numeral 18 is coupled between the input 14 and the output 16 of the amplifier 12.

The circuit 10 further includes comparing circuitry 20 which is coupled to the output 16 of the amplifier 12 and which includes an integrator 22. The output of the comparing circuitry 20 is connected to control circuitry 24 which is operative in response to a signal level received from the comparing circuitry 20 to adjust the impedance of, i.e., switch in or switch out impedances in, the impedance circuitry 18 as will be described in greater detail below.

Preferably, and as shown in the drawing, the automatic range selection circuit 10 also includes a visual display device 26, such as a digital panel meter, coupled to the output of the amplifier 12, a range decoding circuit 28 coupled to the control circuit 24 and operative in response to the output from the control circuit 24 to supply a decimal point placement signal to the visual display device 26, and analog processing amplifiers generally identified by reference numeral 30 coupled between the output of the amplifier 12 and the inputs to the comparing circuitry 20 and the visual display device 26.

The adjustable impedance circuitry 18 includes a resistor 32 and capacitor 34 connected between the input 14 and the output 16 of the amplifier 12 and at least three inpedance circuits 41,42 and 43 also connected between the input 14 and the output 16 of the amplifier 12. Each impedance circuit 41-43 includes an electronic switch 51,52,53 connected in series with a parallel connected resistor 61,62,63 and capacitor 71,72,73 as shown. Each of the electronic switches 51-53 is preferably a field effect transistor (FET) as shown.

The comparing circuitry 20 includes an over range comparator 74 and an under range comparator 76. One input of each of the comparators 74,76 is coupled to the output 16 from the amplifier 12. The other input for each comparator 74,76 is connected to one of two reference voltage levels which are established by a voltage divider circuit 78 which is connected between a source of reference voltage $V_{REF}$ and a ground or common conductor 80 for the circuit 10. In this respect, and as shown, the voltage divider 78 comprises three resistors 81,82 and 83 connected between $V_{REF}$ and the common conductor 80. The first or upper voltage level $V_1$ is established between the resistors 81 and 82 and is connected to an input of the comparator 74. The lower voltage level $V_2$ is established between resistors 82 and 83 and is connected to one input of the comparator 76.

The outputs from the comparators 74 and 76 are coupled, respectively, through diodes 84 and 86 (which have reverse polarities as shown) and a resistance 88 to the input of the integrator 22 which includes an integrating amplifier 90 and an integrating capacitor 92 connected between the input and output of the integrating amplifier 90. The output signal level at the output of the integrator 22 is connected through a mechanical switch 94 to the control circuitry 24.

The control circuitry 24 includes three FET driver/comparators 101,102 and 103. One input of each of the comparators 101-103 is connected to the mechanical switch 94 and the other input of each of the comparators 101-103 is connected to a reference voltage level. In this respect, the comparator 102 is connected to system ground, comparator 101 is connected to a negative voltage level $V_3$ and comparator 103 is connected to a positive voltage level $V_4$. These voltage levels $V_3$ and $V_4$ are established by a voltage divider circuit 104 connected between a positive voltage source +V and a negative voltage source −V. The negative voltage level $V_3$ connected to one input of the comparator 101 is established between resistors 111 and 112 of the voltage divider circuit 104 and the positive voltage level $V_4$ connected to one input of comparator 103 is established between resistors 112 and 113 of the voltage divider circuit 104.

The output of each of the comparators 101-103 is coupled through a diode 121,122,123, to a gate terminal 131,132 or 133 of one of the FET's 51,52 or 53. Each gate 131-133 is also coupled through an impedance 142,143 or 144 to the ground or common conductor 80 for the circuit 10.

The output from each one of the comparators 101-103 is also connected to the range decoding circuit 28 which, depending upon the voltage appearing at the outputs of the FET driver/comparators 101-103, can then generate a decimal point placement signal which is supplied to the visual display device 26. In this respect, it will be understood, that the outputs on the comparators 101-103 determine the amount of impedance coupled across the amplifier 12 and thereby determine the gain of the amplifier 12 which in turn determines the measuring range for the amplifier 12. Also, it will be understood that this is accomplished in an analog manner without the use of digital circuits.

The mechanical switch 94 has five poles one of which is connected to the output of the integrator 22 and the other four of which are connected to different reference voltage sources corresponding to the different ranges of the automatic range selection circuit 10. The switch 94 allows one to manually set the range for the circuit 10 by merely moving the mechanical switch 94 to one of these four poles.

The analog processing amplifiers 30 adjust the output from the amplifier 12 so that it can be properly utilized by the visual display device 26 to indicate a desired number corresponding to the output from the amplifier 12. In other words the analog processing amplifiers 30 are utilized for calibration purposes.

In the operation of the automatic range selection circuit 10, the comparators 74 and 76 compare an output signal level at the output 16 of the amplifier 12 with the upper voltage level $V_1$ and the lower voltage level $V_2$ previously established with voltage divider 78 to be over or under acceptable output levels for the amplifier 12. When a signal level on the output 16 of the amplifier 12 is over or under the voltage levels $V_1$ or $V_2$, the appropriate comparator 74 or 76 charges or discharges the integrating capacitor 92 causing the output signal level at the output of the integrator 22 to increase or decrease. The FET driver/comparators 101-103 compare this signal level at the output of the integrator 22 with the reference voltage levels $V_3,V_4$ established by the voltage divider 104 and turn on or turn off the FET electronic switches 51-53 as necessary to change the gain of the input amplifier 12 until a steady state condition is reached where there is no longer any output signal from the capacitors 74 or 76 leaving the integrator 22 without a signal to integrate. At that point in time, the entire circuit 10 is stable with the gain of input amplifier 12 set for the proper range.

When the gain for input amplifier 12 is set too low for a low level signal, a negative voltage from the under range comparator 76 is integrated by the integrator 22 until the FET driver/comparators 101-103 switch enough impedance into the amplifier feedback circuits 41-43 to increase the gain of the amplifier 12 to an amount where the signal level at the output 16 falls within an acceptable range, at which point the negative voltage from the under range comparator 76 drops back to zero leaving the integrator 22 without a signal to integrate. Should the gain of the amplifier 12 be set too high for a high level signal, a similar sequence of events will occur except that a positive voltage from the over range comparator 74 will be integrated ultimately causing a decrease rather than an increase in the gain of the input amplifier 12.

As stated above, the range decoding circuit 28 is connected to the output of each of the FET driver/comparators 101-103 to control the placement of the decimal point in the visual display device 26.

Also, it will be understood that various integrator output level ranges are associated with specific input ranges to the input amplifier 12.

From the foregoing description it will be apparent that the automatic range selection circuit 10 of the present invention has a number of advantages some of which have been described above and others of which are inherent in the invention. Also, it will be apparent to one skilled in the art, that obvious modifications and variations can be made to the circuit 10 without departing from the scope of the invention. Accordingly the scope of the invention is only to be limited as necessitated by the accompanying claims.

I claim:

1. An automatic range selection circuit, which comprises:
   an amplifier;
   adjustable impedance means coupled between an input and an output of said amplifier for controlling the gain of said amplifier;

analog means for comparing the signal at said output from said amplifier with an upper voltage level and a lower voltage level, said analog comparing means including an under-range comparator, an over-range comparator and an integrator, each of said comparators being coupled to the output of said amplifier and having and output coupled to said integrator;

said analog comparing means being operable to generate a positive or negative control signal at an output of said integrator when the signal at said amplifier output is higher than said upper voltage level or lower than said lower voltage level; and analog control means coupled to said adjustable impedance means and responsive to said control signal from said comparing means for automatically increasing or decreasing the amount of impedance coupled across said amplifier until the level of the signal at said output of said amplifier is between said upper and lower voltage levels.

2. The automatic range selection circuit according to claim 1 wherein said adjustable impedance means includes at least one impedance circuit including an electronic switch connected in series with an impedance across said amplifier and said control means includes driver/comparator means having one input coupled to a reference voltage level, another input coupled to said output of said analog comparing means and an output coupled to a control terminal of said electronic switch.

3. The automatic range selection circuit according to claim 2 wherein said electronic switch is a field effect transistor.

4. The automatic range selection circuit according to claim 1 wherein said adjustable impedance means includes at least three impedance circuits, each impedance circuit including an impedance connected in series with an electronic switch across said amplifier and said analog control means includes a driver/comparator circuit comprising three driver/comparators, each driver/comparator having one input coupled to said output of said comparing means, one input connected to one of three reference voltage levels, and an output coupled to a control terminal for one of said electronic switches.

5. The automatic range selection circuit according to claim 4 wherein said output of each said driver/comparator is coupled through a diode to said control terminal which is coupled through an impedance to a common conductor for said automatic range selection circuit.

6. The automatic range selection circuit according to claim 4 including a range decoding circuit having inputs coupled, respectively, to said outputs of said driver/comparators and a visual display device coupled to said output of said amplifier, the output of said analog range decoding circuit also being coupled to said visual display device for supplying a decimal point placement signal to said visual display device.

7. The automatic range selection circuit according to claim 1 including a visual display device coupled to said output of said amplifier, and analog processing amplifying means coupled between said output of said amplifier and said analog comparing means for adjusting the magnitude of said signal at said output of said amplifier for utilization by said analog comparing means and said visual display device.

8. The automatic range selection circuit according to claim 1 wherein said comparing means is connected through a mechanical switch to said control means and wherein said mechanical switch includes a plurality of pole contacts each coupled to a predetermined control signal level, whereby said mechanical switch can be manually operated to manually connect a desired control signal level to said control means to establish a desired gain for said amplifier.

9. A spectrofluorometer including an optical energy detection device having an output coupled to an automatic range selection circuit according to claim 1.

10. The spectrofluorometer with automatic range selection circuit according to claim 9 where the optical energy detection device is a photomultiplier tube.

* * * * *